(12) United States Patent
Solgaard et al.

(10) Patent No.: US 8,712,065 B2
(45) Date of Patent: Apr. 29, 2014

(54) TRANSDUCER DISPLACEMENT PROTECTION

(75) Inventors: Mads Emil Solgaard, Lyngby (DK); Bjørn Sand Jensen, Nærum (DK)

(73) Assignee: Bang & Olufsen Icepower A/S, Lyngby (DK)

( * ) Notice: Subject to any disclaimer, the term of this patent is extended or adjusted under 35 U.S.C. 154(b) by 678 days.

(21) Appl. No.: 12/453,090

(22) Filed: Apr. 29, 2009

(65) Prior Publication Data

US 2009/0268918 A1 Oct. 29, 2009

(30) Foreign Application Priority Data

Apr. 29, 2008 (DK) .................. 2008 00604

(51) Int. Cl.
*H03G 11/00* (2006.01)
(52) U.S. Cl.
USPC .......................................... 381/55; 381/397
(58) Field of Classification Search
USPC .......................................... 381/55, 56, 58, 59
See application file for complete search history.

(56) References Cited

U.S. PATENT DOCUMENTS

| | | | |
|---|---|---|---|
| 4,327,250 A * | 4/1982 | von Recklinghausen | 381/55 |
| 4,995,113 A * | 2/1991 | Robineau et al. | 381/117 |
| 5,528,695 A * | 6/1996 | Klippel | 381/55 |
| 5,577,126 A * | 11/1996 | Klippel | 381/59 |
| 5,729,611 A * | 3/1998 | Bonneville | 381/55 |
| 6,058,195 A * | 5/2000 | Klippel | 381/96 |
| 7,372,966 B2 * | 5/2008 | Bright | 381/55 |
| 2004/0178852 A1 * | 9/2004 | Neunaber | 330/284 |
| 2005/0047606 A1 * | 3/2005 | Lee et al. | 381/59 |
| 2006/0133620 A1 * | 6/2006 | Lashkari | 381/59 |
| 2006/0147049 A1 * | 7/2006 | Bayley et al. | 381/56 |
| 2007/0160221 A1 * | 7/2007 | Pfaffinger | 381/59 |
| 2008/0175422 A1 * | 7/2008 | Kates | 381/316 |
| 2011/0182435 A1 * | 7/2011 | Gautama | 381/55 |
| 2012/0179456 A1 * | 7/2012 | Ryu et al. | 704/200.1 |
| 2012/0300949 A1 * | 11/2012 | Rauhala et al. | 381/55 |
| 2013/0077795 A1 * | 3/2013 | Risbo et al. | 381/55 |

FOREIGN PATENT DOCUMENTS

| | | |
|---|---|---|
| WO | WO 01/03466 | 1/2001 |
| WO | WO 2005/091672 | 9/2005 |

* cited by examiner

*Primary Examiner* — Minh-Loan T Tran
*Assistant Examiner* — Fazli Erdem
(74) *Attorney, Agent, or Firm* — Harness, Dickey & Pierce, P.L.C.

(57) ABSTRACT

This invention relates to the mechanical protection using digital processing and a predictive estimation of instantaneous displacement of the voice coil in a loudspeaker transducer.

The invention solves the problem of limiting the coil displacement of the transducer by applying a look-a-head based linear or non-linear predictor and a controller operating directly on the displacement signal in order to finally convert back into the incoming signal domain.

14 Claims, 4 Drawing Sheets

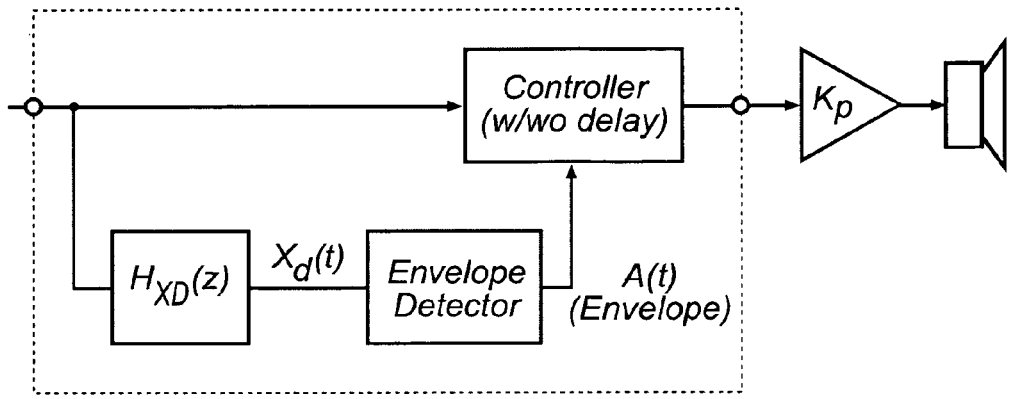
(Prior art) *Fig. 1*
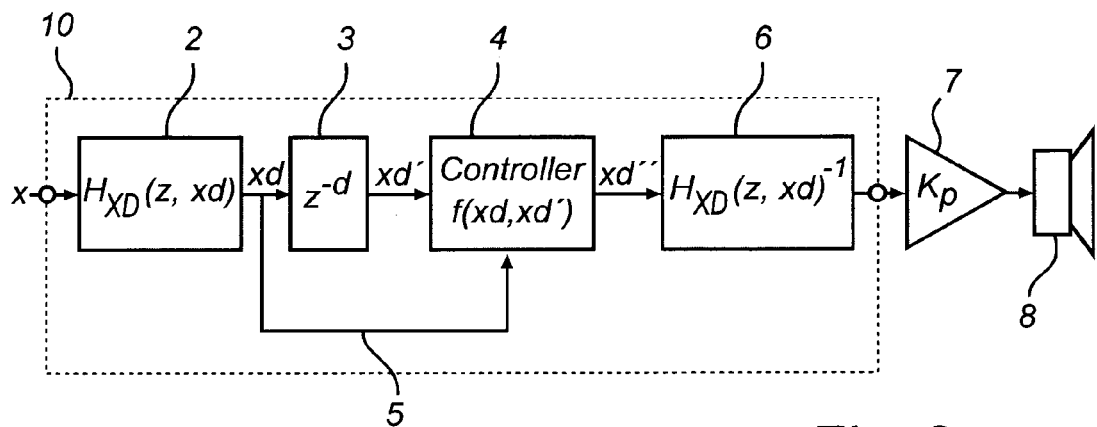
*Fig. 2*

TRANSDUCER DISPLACEMENT PROTECTION

FIELD OF THE INVENTION

The present invention relates to the mechanical protection of a transducer for use in a loudspeaker using digital processing and a predictive estimation of instantaneous displacement of moving element, e.g. the voice coil in an electro dynamic transducer.

In particular, the present invention relates to a method for protecting transducers in systems where a transducer is part of a loudspeaker and forced to move at the mechanical limit—or even forced by the applied amplification to operate outside the mechanical limit of the transducer itself, causing mechanical clipping and/or distortion if the transducer is not protected and controlled properly.

In this text the term transducer will be used with reference to a single electro dynamic transducer for reproducing sound. The term loudspeaker will be used with reference to an assembly of one or more transducers in some form of cabinet which includes an acoustically closed enclosure, a vented or bass reflex enclosure or an acoustic horn.

BACKGROUND OF THE INVENTION

In standard loudspeaker systems electro dynamic transducers can fail due to either excessive voice coil excursion, causing mechanical clipping, or by overheating of the voice coil causing degradation of the materials.

A system in FIG. 1, as disclosed in U.S. Pat. No. 5,528,695, uses a prediction of the displacement in order to limit the incoming signal in a feed-forward manner with the purpose of limiting the displacement caused by this applied signal. Limitations of this system mean that the non-linear behaviour of the system is not included in the prediction of the instantaneous displacement $x_d(n)$ and hence a suboptimal control may be obtained if the system is designed to operate at the mechanical limit or beyond for a significant period of time. Furthermore it describes multiple feedback configurations which do not guaranties a limitation that is fast enough, hence a suboptimal threshold must be applied limiting the performance of the system.

Document WO 2005/091672 describes principles for limiting the displacement by filtering the incoming voltage related signal by a transducer response related shelving filter response. Shortcomings of this system relates to the fact that no explicit look-a-head time is included for the system to limit the signal. This implies that an instantaneous peak in displacement may parse through the system without proper attenuation if the filtering is not done with enough headroom leading to suboptimal performance in situations where maximum output is required.

Document WO 01/03466, describes a system for multi-band protection based on a power measurement and estimate. This system does not directly apply the physical measure of displacement in order to limits this quantity, but do so in an implicit overall consideration of the system capabilities leading to suboptimal control.

SUMMARY OF THE INVENTION

According to a first aspect of the invention, there is provided a method for controlling and limiting the voice coil displacement of an electro dynamic transducer with the means of protecting the transducer from extensive movement by the moving part of the transducer as a response to the applied input signal, the method comprises:

- Calculating a prediction of the instantaneous displacement based on the digital audio input signal,
- delay of the predicted displacement signal with a predefined number of samples,
- controlling the predicted displacement as calculated and delayed,
- apply an inverse filter structure to transform from the predicted displacement into the original signal domain, being a voltage or current related signal.

The present invention relates solves the problem of limiting the displacement of the transducers moving element by applying a look-a-head based predictor and a controller operating directly on the displacement signal in order to finally convert back into the incoming signal domain. The predictor and controller may be based on a linear or non-linear model of the transducer. In case the transducer is highly non-linear a non-linear compensation method may be used as the latter step.

The prediction may be performed by a predictive filter in the form of a minimum-phase discrete time filter structure based on the transducers voltage/current to displacement response. The inverse filter structure is preferably the inverse of the predictive filter. The predictive filter and the inverse filter structure may be linear or non-linear.

The predictive filter may be a minimum phase discrete time, infinite impulse response filter with the coefficients calculated based on the transducers voltage/current to displacement transfer function.

The prediction means and inverse prediction means may be linear filter structures only approximating the true transducer voltage/current to displacement response. Alternatively, the inverse filter structure is non-linear filter structure to compensate the non-linear behaviour in the transducer.

The predictive filter and inverse structure may be updated with a predefined interval based on a measurement of the current in the transducer. For example, the predictive filter and inverse structure may be updated when one or more important properties have changed significantly based on a measurement of the current in the transducers terminals.

The controlling may be performed by a low pass filter, defining a dynamic behavior of a controller. The input parameters to the dynamic function may be an attack time, release time and displacement threshold, dependent on the transducers input signal-to-displacement response, and the desired behaviour of the controller according to psychoacoustic objectives.

The controlling may be performed by a gain function which multiplies a calculated gain factor, $g(n)$, with the delayed predicted displacement, the instantaneous gain factor is calculated based on the ratio between the non-delayed predicted displacement and the displacement threshold $x_{d,th}$, given as ratio$(n) = x_{d,th}/x_d(n)$, the ratio is feed to a dynamic network consisting of one or more filters which defines the attack and release time.

The controlling may be performed by a gain function with the ratio calculated as ratio$(n) = (x_{d,th}/x_d(n))^s$ where $s$ ($0 < s < 1$) defines a transfer function shape of the controller.

Standard means are supporting the calculations and the control function applied by the method, the means being:
- a digital signal processor,
- a comparator,
- a peak detect and hold method,
- one or more linear low-pass filter structures for defining the dynamic behaviour of the controller,
- one multiplier.

Standard means are supporting the calculations and the control function applied by the method, the means being:
- a digital signal processor,
- one or more filters for defining frequency selective bands,
- one or more comparators in each band,
- one or more gain functions in each band,
- one or more low-pass filters in each band.

Additional filter means are supporting control function applied by the method, the means being:
- linear filter for filtering the delayed predicted displacement signal,
- means for calculation the coefficient in the filter,
- one or more low pass filters for defining the attack and release behaviour of the response.

BRIEF DESCRIPTION OF THE DRAWINGS

Preferred embodiments are described with reference to the figures.

FIG. 1 displays a displacement protection system according to Prior Art.

FIG. 2 displays a first embodiment of the present invention.

DETAILED DESCRIPTION OF CURRENTLY PREFERRED EMBODIMENTS

Figure 3:
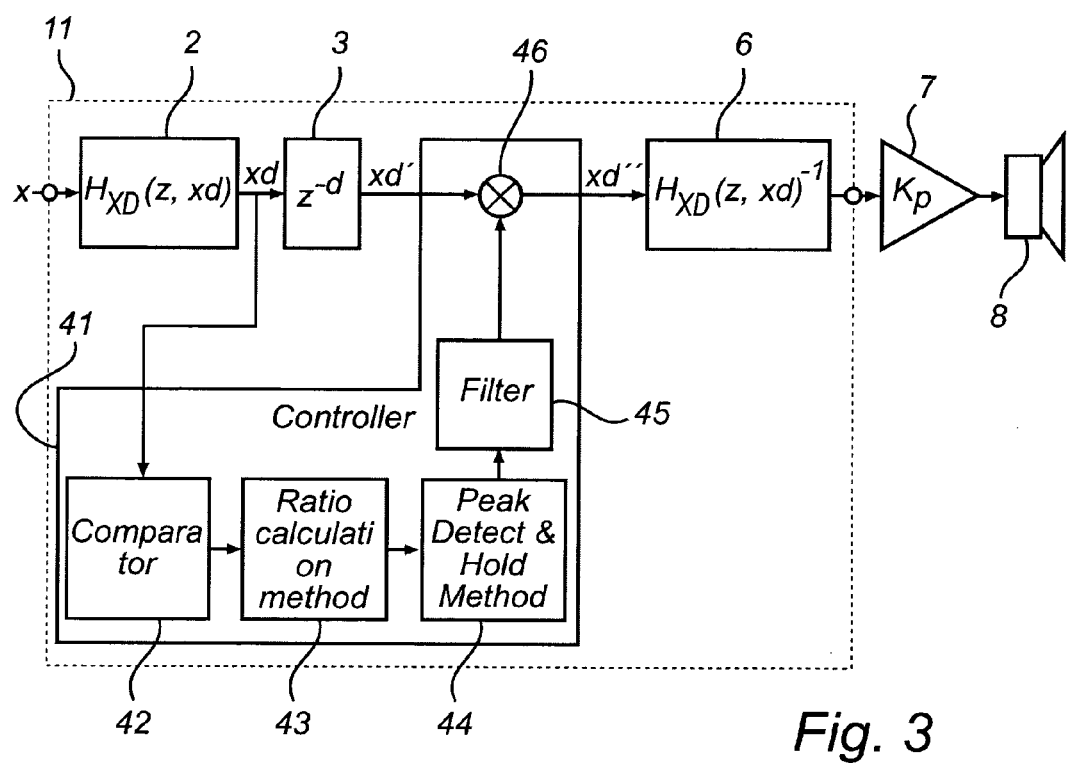
FIG. 3 displays a second embodiment of the present invention.

FIG. 2 displays the overall aspects of a prediction system 10 according to a first embodiment of the present invention. An input signal x is feed to the input of a predictor 2. In a first embodiment of this invention this predictor may comprise a linear filter described by the linear transfer function $$H(z) = \frac{\sum_{n=0}^{N} B(n) z^{-n}}{\sum_{m=0}^{M} A(m) z^{-m}}$$

where H(z) describes the input signal-to-displacement frequency dependent relationship denoted $X_d(z)/X(z)$. In a voltage driven system the input signal will be directly proportional to the voltage applied to the transducer—or in a current driven system; to the current applied to the transducer.

In one embodiment of the invention the parameters or coefficients are directly extracted from a well know transducer model valid for electro-dynamic transducers, e.g. provided by a Thiele-Small parameterization. For a closed acoustic enclosure the parameters are often modelled as a second order system in which the linear version of the transfer function can be written in the continuous time domain as experienced.

By applying standard discrete time techniques such as the bilinear function or impulse invariance method a discrete time variant can be extracted as $$H(z) = \frac{B(z)}{A(z)} = \frac{b_2 z^{-2} + b_1 z^{-1} + b_0}{a_2 z^{-2} + a_2 z^{-1} + a_0}$$

where $\{b_2, b_1, b_0, a_2, a_1, a_0\}$ are given by as experienced.

Note that with other types of models of the enclosure, higher order filters may be used, leading to a different equation.

The output from the predictor 2, xd, is supplied to a delay element 3, the output, xd', from the delay element is parsed to the input of a controller 4. The controller 4 is also provided with the output xd from the predictor 2, via a forward path 5, and the controller effectively defines a non-linear transfer function xd"=f(xd',xd) from input to output.

The controller 4 leads to a number of aspects of this invention; specifically the controller may be defined by either of the following control means applied directly on the delayed, predicted displacement signal:
- A Static Transfer Function,
- Dynamic Transfer Function,
- Dynamic Transfer Function in multiple frequency bands,
- Time Varying Linear Filter with Coefficient Calculation method All aspects will lead to a controlled/limited displacement signal xd".

The output of the controller 4, xd", is parsed to the input of an inverse predictor 6, which converts the displacement signal into the original signal domain. The output from the inverse predictor 6 is supplied to an amplifier 7, which drives a transducer 8.

In one aspect of the invention, the inverse prediction filter is a linear filter, and in case the predictive filter a minimum phase linear filter the inverse filter is directly defined by the mapping of the H(z) zeros, i.e. given by the roots of B(z) into poles providing the new denominator A(z) and similarly will the poles of H(z) given by the roots of A(z) be mapped into the new nominator B'(z), i.e.

$$H(z)^{-1} = \frac{B'(z)}{A'(z)}$$

In a different aspect of the invention, the predictive filter is linear but not minimum phase—or certain ill conditioned roots may exist of B(z)—and an approximation is required in order to ensure stability of the inverse prediction filter.

In another aspect the inverse filter is structure non-linear, with the inverse non-linear filter designed via a non-claimed means to compensate the non-linear behaviour of the transducer based on a non-linear model of the transducer.

FIG. 3 shows a displacement protection system 11 according to a second embodiment of the invention. Similar elements of the displacement protection system have been given identical reference numbers as in FIG. 2, and will not be described again. Here, the controller 41 is arranged to apply a gain factor directly to the predicted displacement signal, leading to simple control design.

Similar to FIG. 2, the system accepts a digital audio input x which is passed to the input of the predictor 2 for prediction the displacement dx, which is split and passed to the input of the delay element 3 which delays the predicted displacement in order to provide a look-a-head time xd' to allow the controller 41 to limit the physical response in time—and with needed precision. The output of the predictor is also passed without a delay to a secondary input of the controller 41.

The controller 41 is a dynamic non-linear function. It comprises a comparator 42 which compares the secondary input to a threshold determined by the total system gain and transducer characteristics. If the secondary input is above the threshold, a calculator 43 calculates an attenuation, coined the ratio, that is required of the primary input xd.

The calculated ratio is passed to peak detecting and hold means 44, which ensures that the ratio is being enforced for the full time delay defined by the delay element. The output of the peak detect and hold means 44 is parsed to a filtering means 45 which consists of a number of low-pass filter for defining the temporal/envelope behaviour of resulting attenuation, providing optimal sound quality for a given application.

The output of the filter 45 is used in a gain element 46, to attenuate the output xd' of the delay element 3, in order to control the delayed displacement signal, often with the purpose to keeping it below the threshold.

The output xd" of the controller 41 is the delayed and controlled displacement signal which is passed to the input of the inverse predictor 6, which may be the mathematical inverse filter structure of 2. The inverse prediction means transforms the displacement signal back into the original signal domain, i.e. normally a signal directly proportional with the voltage or current applied to the transducer.

Just as in FIG. 2, the output of the protection system 10 is passed to the input of a power amplifier system 7 from which the output is an amplified voltage signal. The voltage or potentially current signal is applied to the terminals of a transducer 8.

The inverse prediction means/filter structure 2 can, as previously indicated, be a non-linear function taking into account the non-linear behaviour of most existing transducers driven at or close to the mechanical displacement limit.

Figure 4:
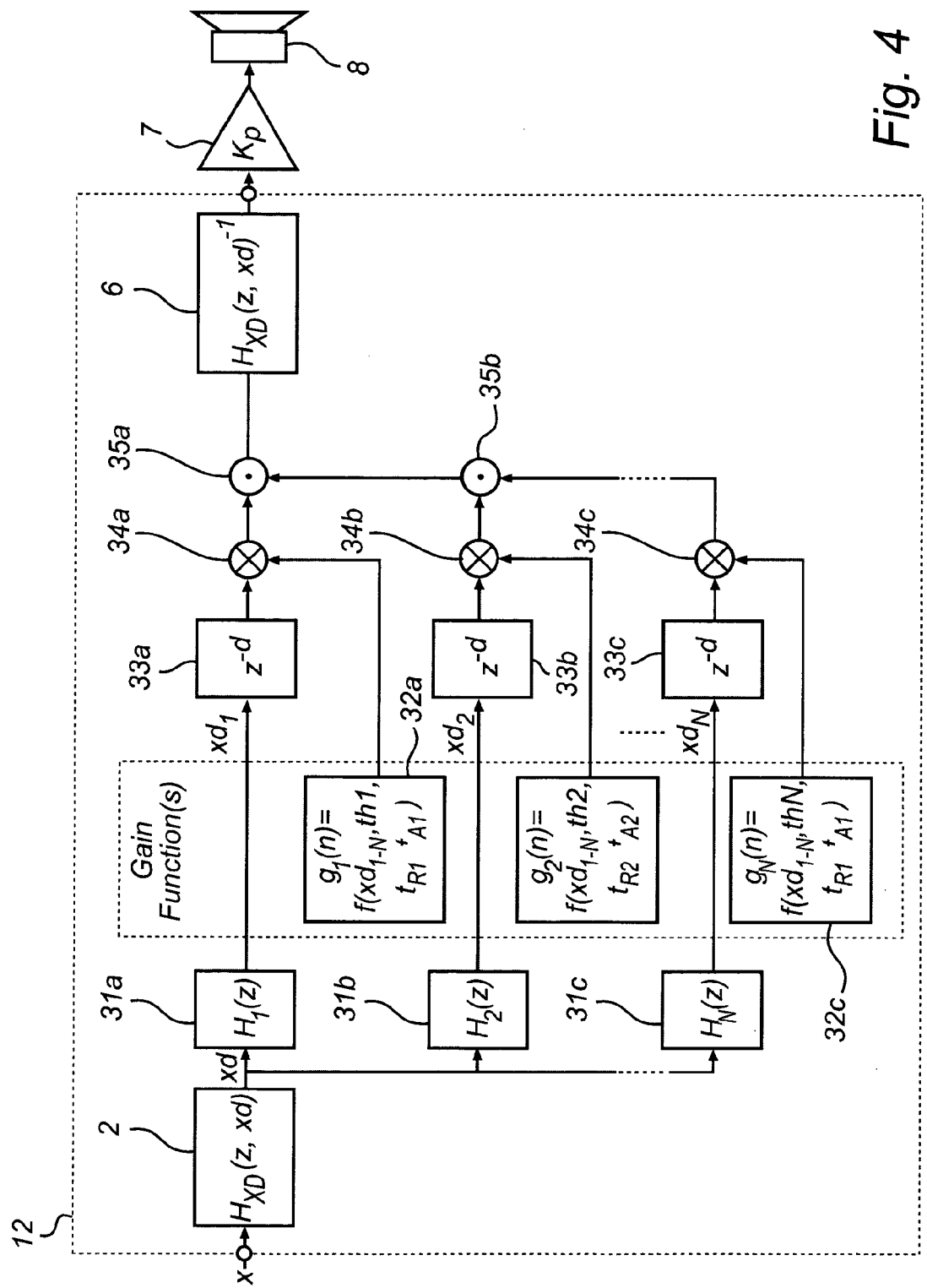
FIG. 4 displays a third embodiment of the present invention.

FIG. 4 displays another preferred embodiment of the invention, where the controller comprises a number of frequency selective bands, for optimal frequency dependent control; this leading to a multiband control design.

The output from the predictor 2 is here passed to analysis filters (31a-c), which separates the displacement signal into at least two frequency bands. The analysis filters (31a-c), coined $H_1(z)$-$H_N(z)$, can be freely chosen, but will often be transducer dependent in order only to attenuate the displacement in the frequency band actually responsible for the instantaneous displacement—and possibly provide a gain in other frequency bands.

The output from each analysis filter is passed to an individual delay element (33a-c) which is not a part of the controller as such.

The output from each analysis filter is furthermore passed to secondary inputs of the controller, comprising gain factor calculators 32a-c, gain elements 34a-c, and summation elements 35a-c. The gain factor calculators 32a-c calculate the gain factor needed to limit displacement in each frequency band respectively, in order to get below the total or individual displacement threshold.

The output from the delay elements (33a-c) is passed to the primary input of each gain element 34a-c, respectively. where the individual displacement signals ($xd_{1-N}$) are multiplied with the calculated individual gain factors; in a process similar to that in FIG. 3.

The output from the gain elements is parsed to the summation element 35a-b, in order to construct the output of the controller.

The output of the controller is parsed to the input of the inverse predictor 6 and used to drive the transducer as described in relation to FIGS. 2 and 3.

In another aspect of the invention, the output of all the analysis filters is passed to all the individual gain factor calculations in order to acquire information regarding the total displacement for using in the gain factor calculation for each band.

In one aspect of the invention, the individual gain factors, $g_{1-N}(n)$ are calculated based on experience.

Figure 5:
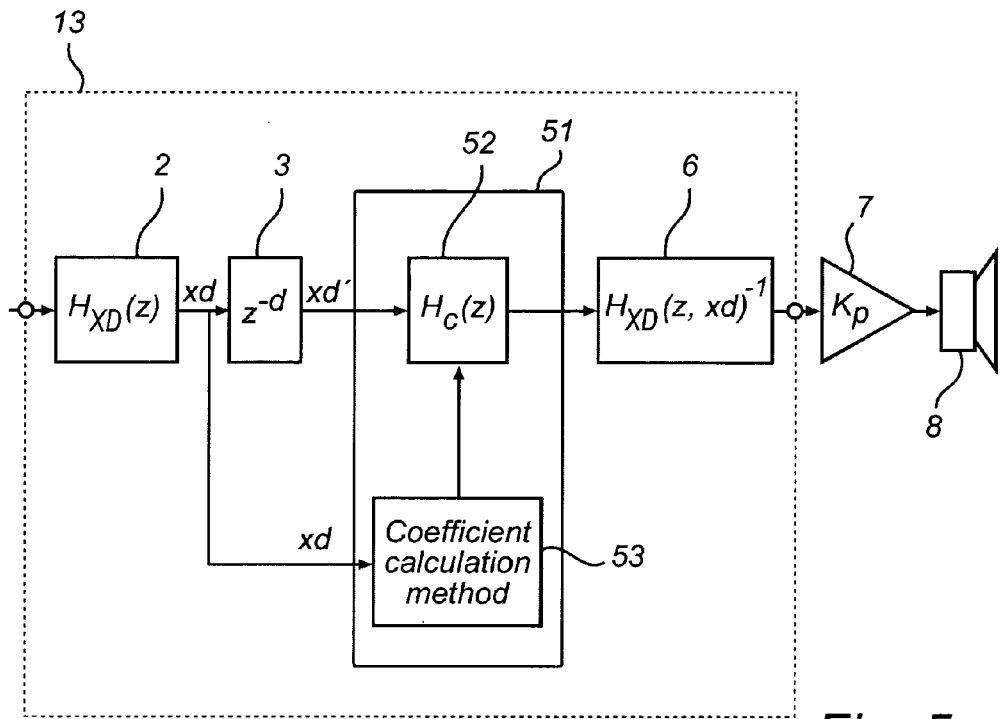
FIG. 5 displays a fourth embodiment of the present invention.

FIG. 5 displays a displacement protection system 12 according to yet another preferred implementation of the invention. Here, the controller 51 comprises a time varying filter 52 which is continuously updated by means of a coefficient calculator 53; leading to a filter based control design.

The predicted displacement $x_d$ calculated by the predictor 2, is passed to the coefficient calculator 53, in which the response of the control filter 52 is determined.

The control or limitation is performed by the filter, $H_c$ 52 with a general discrete time linear transfer function.

$$H(z) = \frac{\sum_{n=0}^{N} B(n)z^{-n}}{\sum_{m=0}^{M} A(m)z^{-m}}$$

In one aspect of the invention, $H_c$ is a first order high-pass filter, with the coefficient values as experienced.

In another aspect of the invention the $H_c$ is given by a complex transfer function which allows for higher order linear manipulation of the overall transfer function, e.g. providing possibility to enhance the low-frequency displacement of the transducer, while still controlling the displacement of the transducer.

Figure 6:
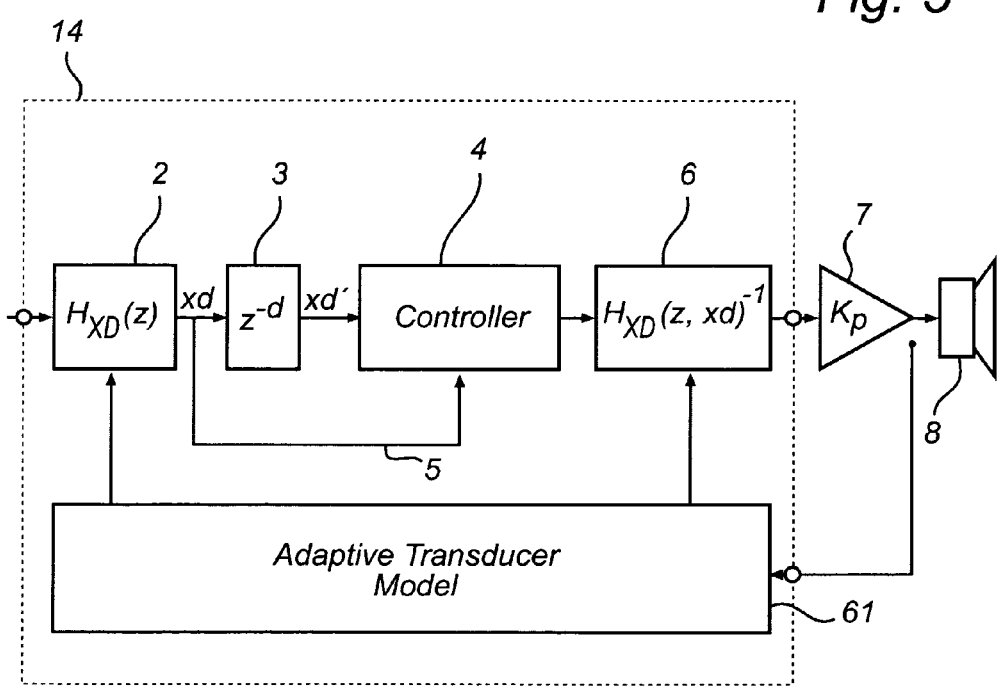
FIG. 6 displays a fifth embodiment of the present invention where the predictive and inverse predictive filters are updated based on a non-linear model.

An further aspect of the invention relates to an adaptive model of the physical transducer to be controlled, i.e. the non-linear filter $H_{xd}(xd, z)$ or the linear filter $H_{xd}(z)$ is updated during operation to account for changes in the physical transducer. The transducer may change due the thermal heating and changes in various mechanical parameters during operation, for example will the suspension often change during operation of an electro-dynamic transducer potentially leading to an increase in the displacement. This may be considered as an adaptive control design A displacement protection system 14 according to yet another preferred implementation of the present invention is shown in FIG. 6. Here, a state variable, for example the current running in the transducer terminals, is feed to an adaptive digital transducer model 61 which updates the predictive filter in the predictor 2 and the inverse predictive filter in the inverse predictor 6 during operation.

The invention may be applied in any kind of loudspeakers systems to protect the transducers. This includes active speaker systems e.g. in, but not limited to: PC's laptops, cell phones, media players, Audio/Video systems, PDA's, and PC screens.

LIST OF APPLIED ABBREVIATIONS/SYMBOLS $z^{-d}$ a delay in a discrete time system, the delay is d samples, xd(n) and xd, the instantaneous displacement, H(z) a linear transfer function (filter function), $H_{XD}$ (z) a linear transfer function (filter function) representing the transfer function of the transducer (from signal to displacement), $H_{XD}$(z, xd) a non-linear transfer function (filter function) dependent on the current displacement, g(n) the gain at time n, f(.) an arbitrary function,
th displacement threshold used in the dynamic function,
tR release time used in the dynamic function,
tA attack time used in the dynamic function.

The invention claimed is:

1. A method for controlling and limiting voice coil displacement of an electro dynamic transducer, the method comprising:
    predicting an instantaneous displacement signal based on a digital audio input signal;
    delaying the predicted displacement signal a predefined number of samples;
    controlling the delayed, predicted displacement signal using the predicted displacement signal as input, by:
    applying a gain function which multiplies a calculated gain factor, g(n), with the delayed predicted displacement signal, the calculated gain factor being calculated based on a ratio between the predicted instantaneous displacement signal and a displacement threshold $x_{d,th}$ determined by a total system gain and transducer characteristics, given as ratio(n)=$x_{d,th}/x_d(n)$;
    applying an inverse filter structure to transform the predicted displacement signal into a signal domain of the digital audio input signal;
    amplifying the controlled signal domain signal; and
    applying the amplified controlled signal domain signal to the electro dynamic transducer.

2. The method according to claim 1, wherein the predicting is performed using a predictive filter including a discrete time filter structure based on a voltage/current to displacement response of the transducer.

3. The method according to claim 2, further comprising:
    inverting the predictive filter;
    wherein the applying an inverse filter structure includes using the inverted predictive filter as the inverse filter structure.

4. The method according to claim 2, wherein the predictive filter is a minimum phase discrete time, infinite impulse response filter with coefficients calculated based on a voltage/current to displacement transfer function of the transducer.

5. The method according to claim 2, further comprising:
    updating the predictive filter and inverse filter structure with an interval, the updating based on a measurement of current in the transducer.

6. The method according to claim 2, further comprising:
    updating the predictive filter and inverse filter structure upon a significant change in one or more properties based on a measurement of current in terminals of the transducer.

7. The method according to claim 1, wherein the controlling includes applying one or more low-pass filter structures to define a dynamic behavior of a controller.

8. The method according to claim 7, wherein input parameters to the dynamic behavior include at least one of an attack time, release time and displacement threshold, dependent on the input signal-to-displacement response of the transducer, and a desired behavior of the controller according to psychoacoustic objectives.

9. The method according to claim 1, wherein the controlling includes:
    calculating an instantaneous gain factor based on a ratio between the non-delayed predicted displacement and a displacement threshold $x_{d,th}$, given as ratio(n)=$(x_d th/x_d(n))^s$ where s(0<s<1) defines a transfer function shape of the controller; and
    feeding the ratio to a dynamic network including one or more filters which define an attack and release time.

10. A loudspeaker system, comprising:
    an amplifier to amplify a digital audio input signal;
    a transducer to receive an amplified signal from the amplifier;
    a predictor to predict an instantaneous displacement signal based on the digital audio input signal;
    a delay element to delay the predicted displacement signal a predefined number of samples;
    a controller to limit voice coil displacement of the transducer by controlling the delayed, predicted displacement signal using the predicted displacement signal as input;
    an inverse filter structure to transform the predicted displacement signal into a signal domain of the digital audio input signal;
    an amplifier to amplify the controlled signal domain signal and apply the amplified signal to the transducer,
    wherein the controller includes a gain element arranged to apply a gain function which multiplies a calculated gain factor, g(n), with the delayed predicted displacement signal, the gain factor being based on a ratio between the predicted instantaneous displacement signal and a displacement threshold $x_{d,th}$, determined by a total system gain and transducer characteristics, given as ratio(n)=$x_{d,th}/x_d(n)$.

11. The loudspeaker system according to claim 10, wherein the controller includes,
    a digital signal processor,
    one or more filters for defining frequency selective bands,
    one or more comparators in each band,
    one or more gain functions in each band, and
    one or more low-pass filters in each band.

12. The loudspeaker system according to claim 10, wherein the controller includes:
    a digital signal processor;
    a comparator;
    at least one linear filter for filtering the delayed predicted displacement signal;
    a coefficient calculator to calculate a filter coefficient; and
    one or more low pass filters to define an attack and release behavior of the response.

13. The method according to claim 1, wherein
    the number of samples is determined based on a look-a-head time, and
    the look-a-head time is a time period in which the controller limits the audio signal such that an instantaneous peak in displacement is attenuated prior to transmission of the audio signal to the transducer.

14. A method for controlling and limiting voice coil displacement of an electro dynamic transducer, the method comprising:
    predicting an instantaneous displacement signal based on a digital audio input signal;
    delaying the predicted displacement signal by a fixed number of samples;
    controlling the delayed, predicted displacement signal using the predicted displacement signal as input, by:
    applying a gain function which multiplies a calculated gain factor, g(n), with the delayed predicted displacement signal, the calculated gain factor being calculated based on a ratio between the predicted instantaneous displacement signal and a displacement threshold $x_{d,th}$ determined by a total system gain and transducer characteristics, given as ratio(n)=$x_{d,th}/x_d(n)$;
    applying an inverse filter structure to transform the predicted displacement into a signal domain of the digital audio input signal;

amplifying the controlled signal domain signal; and
applying the amplified signal to the electro dynamic transducer.

\* \* \* \* \*